US012610728B2

(12) United States Patent
Hwang et al.

(10) Patent No.: US 12,610,728 B2
(45) Date of Patent: Apr. 21, 2026

(54) FLEXIBLE SUBSTRATE, METHOD FOR PREPARING THE SAME, AND DISPLAY DEVICE COMPRISING THE SAME

(71) Applicant: LG DISPLAY CO., LTD., Seoul (KR)

(72) Inventors: Heeyeon Hwang, Paju-si (KR); Eun Roh, Paju-si (KR); Nohjin Myung, Paju-si (KR); Seungkyu Lee, Paju-si (KR); Jieun Lee, Paju-si (KR)

(73) Assignee: LG Display Co., Ltd (KR)

( * ) Notice: Subject to any disclaimer, the term of this patent is extended or adjusted under 35 U.S.C. 154(b) by 1134 days.

(21) Appl. No.: 17/408,015

(22) Filed: Aug. 20, 2021

(65) Prior Publication Data

US 2022/0093867 A1 Mar. 24, 2022

(30) Foreign Application Priority Data

Sep. 18, 2020 (KR) ........................ 10-2020-0120379

(51) Int. Cl.
*G09F 9/30* (2006.01)
*C08L 101/12* (2006.01)
*H10K 77/10* (2023.01)

(52) U.S. Cl.
CPC .......... *H10K 77/111* (2023.02); *C08L 101/12* (2013.01); *G09F 9/301* (2013.01)

(58) Field of Classification Search
CPC ................ B32B 27/30; B32B 2327/06; B32B 2266/0235; B32B 27/00; B32B 27/304;
(Continued)

(56) References Cited

U.S. PATENT DOCUMENTS 4,287,317 A * 9/1981 Kitagawa .............. C08F 291/02 525/289
4,999,242 A * 3/1991 Ishiwata .................. C09J 7/385 428/354

(Continued)

FOREIGN PATENT DOCUMENTS

CN 101877331 A 11/2010
CN 107189018 A * 9/2017 ............ C08F 214/06

(Continued)

OTHER PUBLICATIONS

Machine translation of CN-107189018-A, retrieved Mar. 29, 2025. (Year: 2017).*

(Continued)

*Primary Examiner* — Callie E Shosho
*Assistant Examiner* — Krupa Shukla
(74) *Attorney, Agent, or Firm* — Fish & Richardson P.C.

(57) ABSTRACT

A flexible substrate, a method for preparing the same, and a display device including the same, and more particularly, to a flexible substrate including: a first polymer layer including a first polymer; second polymer layers which include second polymers and are located above and below the first polymer layer; and first interfacial crosslinked layers which are located between the first polymer layer and the second polymer layers and include a first crosslinked polymer having a network structure in which the first polymer and the second polymer are crosslinked, in which the stiffness of the first polymer layer is higher than the stiffness of the second polymer layer and the softness of the second polymer layer is higher than the softness of the first polymer layer, a method for preparing the same, and a display device including the same.

6 Claims, 4 Drawing Sheets

100

(58) Field of Classification Search
CPC ....... B32B 7/12; B32B 27/32; B32B 2255/26; B32B 27/308; C08L 101/12; G09F 9/301; H10K 77/111; H10K 71/80; H10K 59/1201; H10K 71/00
See application file for complete search history.

(56) References Cited

U.S. PATENT DOCUMENTS

| | | | |
|---|---|---|---|
| 2010/0272973 A1 | 10/2010 | Lee et al. | |
| 2016/0083628 A1* | 3/2016 | Heimink | C09C 3/12 556/466 |

FOREIGN PATENT DOCUMENTS

| | | |
|---|---|---|
| KR | 960001663 B1 | 2/1996 |
| KR | 100193895 | 6/1999 |
| WO | 2020102280 A1 | 5/2020 |
| WO | WO 2020/102276 A1 | 5/2020 |

OTHER PUBLICATIONS

Misra, Some Physical Properties of Polymers, Chapter 7, Introductory Polymer Chemistry, 1993, p. 19.*
Chinese Office Action dated Mar. 26, 2024 issued in Patent Application No. 202110987281.4 w/English Translation (13 pages).
Office Action in Korean Appln. No. 10-2020-0120379, mailed on Jul. 25, 2025, 20 pages (with English translation).

* cited by examiner

FLEXIBLE SUBSTRATE, METHOD FOR PREPARING THE SAME, AND DISPLAY DEVICE COMPRISING THE SAME

CROSS-REFERENCE TO RELATED APPLICATION

This application claims the priority of Korean Patent Application No. 10-2020-0120379 filed on Sep. 18, 2020, which is hereby incorporated by reference in its entirety.

BACKGROUND

Field of the Disclosure

The present disclosure relates to a flexible substrate, a method for preparing the same, and a display device including the same, and more particularly, to a flexible substrate which is easily prepared by a simple process with an improved impact resistance while maintaining a high folding characteristic, a method for preparing the same, and a display device including the same.

Description of the Background

Recently, as it enters an information era, a display field which visually expresses electrical information signals has been rapidly developed and in response to this, various display devices having excellent performances such as thin-thickness, light weight, and low power consumption have been developed. Specific examples of such a display device may include a liquid crystal display device (LCD), a plasma display panel device (PDP), a field emission display device (FED), an organic light emitting display device (OLED), and the like.

In the meantime, efforts are being performed to diversify a shape and a size of the display device. For example, display devices having various shapes, such as a curved display device having a curved surface or a flexible display device which maintains its display performance even in a bent or curved state, are consistently being developed. A display panel of the flexible display device uses a base substrate having a flexibility so that a rear substrate is disposed below the display panel to suppress the sagging and protect the display panel from the external impact. Such a rear substrate is used in the form of a plastic film to maintain the flexible characteristic.

However, the plastic film used as a rear substrate has an excellent softness but is configured by a thin single layer to have a low stiffness so that there is a problem in that the impact resistance of the display device is degraded.

SUMMARY

Accordingly, the present disclosure is to provide a flexible substrate in which a plurality of layers including different polymers having different mechanical characteristics is cross-linked to improve the stiffness while maintaining a high softness.

In addition, the present disclosure provides a display device which includes a flexible substrate as described above to satisfy the folding characteristic and improve the impact resistance.

Also, the present disclosure provides a simplified preparing process of the flexible substrate by bonding an adhesive layer on and below the flexible substrate by cross-linkage to omit a process of laminating the adhesive layer.

Further, the present disclosure is to provide a preparing method of a flexible substrate which is capable of solving the problem during the process caused by a relatively low modulus of the adhesive layer.

The present disclosure is not limited to the above-mentioned features, which are not mentioned above, can be clearly understood by those skilled in the art from the following descriptions.

According to an aspect of the present disclosure, a flexible substrate includes: a first polymer layer including a first polymer; second polymer layers which include second polymers and are located above and below the first polymer layer; and first interfacial crosslinked layers which are located between the first polymer layer and the second polymer layers and include a first crosslinked polymer having a network structure in which the first polymer and the second polymer are crosslinked, a stiffness of the first polymer layer is higher than a stiffness of the second polymer layer and a softness of the second polymer layer is higher than a softness of the first polymer layer.

According to an aspect of the present disclosure, a display device includes a flexible substrate; and a display panel disposed on the flexible substrate, the flexible substrate includes: a first polymer layer including a first polymer; second polymer layers which are located above and below the first polymer layer and include second polymers; and first interfacial crosslinked layers which are located between the first polymer layer and the second polymer layers and include a first crosslinked polymer having a network structure in which the first polymer and the second polymer are crosslinked, a stiffness of the first polymer layer is higher than a stiffness of the second polymer layer and a softness of the second polymer layer is higher than a softness of the first polymer layer.

According to another aspect of the present disclosure, a preparing method of a flexible substrate includes: preparing a first film including a first layer including a first polymer and a crosslinking agent and a second layer including a second polymer and a crosslinking agent; preparing a second film including a first layer including a first polymer and a crosslinking agent and a second layer including a second polymer and a crosslinking agent; laminating the first film and the second film such that the first layer of the first film is opposite to the first film of the second film; and hardening the laminated first film and second film, and in the hardening, the first polymer of the first film and the first polymer of the second film are crosslinked at an interface at which the first layer of the first film and the first layer of the second film are in contact with each other to form a network structure so that the first film and the second film are bonded, and the first polymer and the second polymer of the first film are crosslinked at an interface at which the first layers and the second layers are in contact with each other, to bond the first layer and the second layer of the first film, and the first polymer and the second polymer of the second film are crosslinked at an interface at which the first layers and the second layers are in contact with each other, to bond the first layer and the second layer of the second film.

Other detailed matters of the exemplary aspects are included in the detailed description and the drawings.

According to the present disclosure, the flexible substrate includes an interfacial cross-linked layer having a network structure in which heterogeneous polymers are crosslinked at an interface where a layer containing a polymer having an excellent softness and a layer containing a polymer having an excellent stiffness are in contact to significantly improve the stiffness while maintaining a high softness.

The display device of the present disclosure includes a flexible substrate which satisfies both the softness and the stiffness to significantly improve the impact resistance with an excellent folding characteristic.

In the preparing method of the flexible display device of the present disclosure, polymers included in each layer are crosslinked to be bonded at an interface where layers having different mechanical properties are in contact so that a process of forming an adhesive layer between the layers may be omitted. Further, the adhesive layers are crosslinked to be bonded to an upper portion and a lower portion of the flexible substrate so that the process of laminating the adhesive layer may be omitted. Accordingly, the preparing process of the flexible substrate is simplified to improve a productivity.

Further, according to the preparing method of the present disclosure, the problem during the process caused by the low modulus of the adhesive layer may be solved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
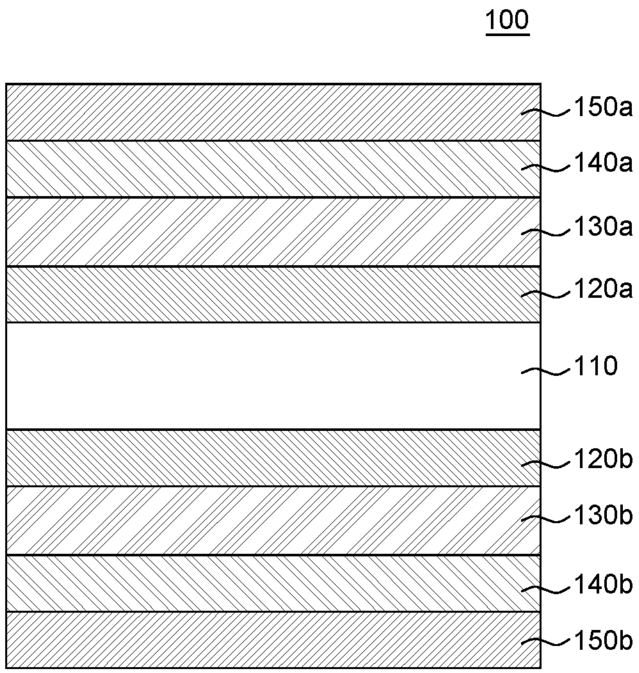
FIG. 1 is a cross-sectional view of a flexible substrate according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a flexible substrate and a display device according to exemplary aspects of the present disclosure will be described in detail with reference to accompanying drawings.

A symbol "*" used in Formula described in the present disclosure refers to a bonding site.

FIG. 1 is a cross-sectional view of a flexible substrate according to an exemplary aspect of the present disclosure. Referring to FIG. 1, a flexible substrate 100 according to an exemplary aspect of the present disclosure includes a first polymer layer 110, first interfacial crosslinked layers **120*a* and 120*b*, second polymer layers 130*a* and 130*b*, second interfacial crosslinked layers 140*a* and 140*b*, and adhesive layers 150*a* and 150*b***. Here, each layer will be described in detail.

The first polymer layer 110 is a layer located in a center in a thickness direction of the flexible substrate 110 and imparts a high stiffness to the flexible substrate 100. The first polymer layer 110 includes a first polymer. The first polymer may be a polymer in which a bulky group is included in a side chain or two or more side chains are bonded to one atom constituting a main chain. The polymer having the structure as described above has a high stiffness because the slip is not easy between polymer chains due to the structural characteristic of the side chains.

For example, a Young's modulus of the first polymer layer 110 is 2000 MPa or higher or 2000 MPa to 3000 MPa so that the stiffness is high.

For example, the first polymer may be a polymer including one or more repeating units selected from the following Formula A. That is, the first polymer may be a homopolymer constituted with one repeating unit selected from the following Formula A or a copolymer including one or more repeating units selected from the following Formula A.

[Formula A]

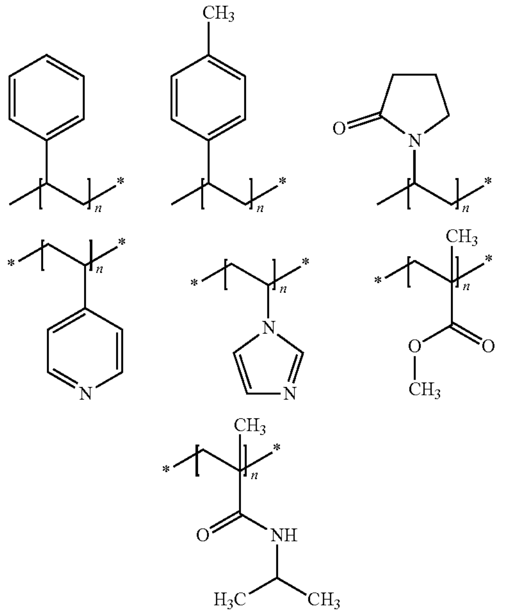

In Formula A, n may be independently an integer of 500 to 4000 or 2000 to 3000.

The repeating units listed in Formula A include a bulky group, such as benzene, pyrrolidone, pyridine, and imidazole, as a side chain, or include two side chains bonded to one carbon atom. The side chains hinder the slip between the polymer chains so that the stiffness is high.

For example, the first polymer may be selected from polystyrene, poly p-methylstyrene, polyvinylimidazole, polyvinylpyridine, polyvinylpyrrolidone, polymethylmethacrylate, and polydialkyl methacrylamide, but is not limited thereto.

The first polymers are crosslinked to form a network structure. When the first polymers are crosslinked to form a network structure, the stiffness of the first polymer layer 110 may be further enhanced.

For example, the first polymer having a network structure may be selected from a compound represented by the following Formula D.

[Formula D]

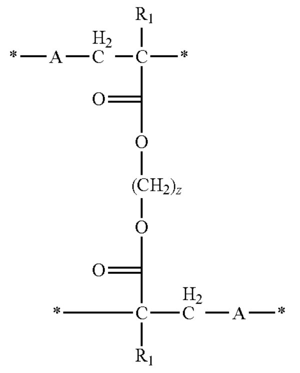

-continued

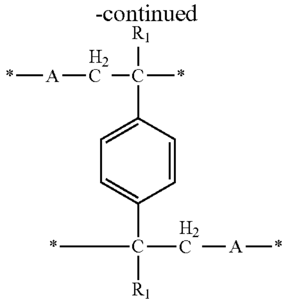

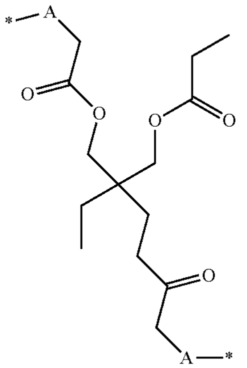

In Formula D, z is an integer of 1 to 10 or 1 to 6 and R1 may be independently selected from hydrogen or a methyl group.

In Formula D, A is a polymer including one or more repeating units selected from the above-mentioned Formula A. That is, in Formula D, A may be a homopolymer constituted with one repeating unit selected from Formula A or a copolymer including one or more repeating units.

The second polymer layers 130*a* and 130*b* are located above and below the first polymer layer 110, respectively and first interfacial crosslinked layers 120*a* and 120*b* are located between the first polymer layer 110 and the second polymer layers 130 and 130*b*.

The second polymer layers 130*a* and 130*b* impart the softness to the flexible substrate 100. The second polymer layers 130*a* and 130*b* include a second polymer. The second polymer may be a polymer having no side chain or a polymer in which a group having a small volume, such as a halogen atom or a hydroxyl group, is bonded to the side chain. The polymer with this structure does not have a side chain or has a side chain having a small volume so that the slip between the chains is easily performed. Therefore, the softness is high. As another example, the second polymer may be a copolymer including a repeating unit which does not have a side chain or including a repeating unit in which a side chain having a smaller volume than that of the first polymer is bonded to the main chain. In the copolymer, a volume of the side chain bonded to the main chain is smaller than that of the first polymer and the number of side chains bonded to the main chain is also small so that the slip between the chains is easy. Therefore, the softness is higher than that of the first polymer.

For example, a Young's modulus of the second polymer layers 130*a* and 130*b* is 1000 MPa or lower or 600 MPa to 800 MPa so that the softness is excellent.

For example, the second polymer may be a polymer including one or more repeating units selected from the following Formula B. That is, the second polymer may be a homopolymer constituted with one repeating unit selected from the following Formula B or a copolymer including one or more repeating units selected from the following Formula B.

[Formula B]

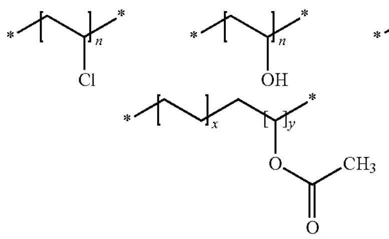

In Formula B, n is independently an integer of 500 to 4000 or 2500 to 3500, x is independently an integer of 300 to 2500 or 1000 to 1500, y may be independently an integer of 300 to 2500 or 1000 to 2500.

Repeating units listed in Formula B do not have a side chain, include a group having a small volume such as chloride or a hydroxyl group as a side chain, or have a structure in which a repeating unit having no side chain and a repeating unit including a side chain having a small volume are copolymerized. Further, one side chain is bonded to one carbon atom which constitutes the main chain. Therefore, the slip between chains is easier than the first polymer and the softness is higher than that of the first polymer.

For example, the second polymer may be selected from poly vinyl chloride, poly vinyl alcohol, poly ethylene, poly (ethylene-co-vinyl alcohol), and poly (ethylene-co-vinyl acetate), but is not limited thereto.

The second polymers are crosslinked to form a network structure. For example, the second polymer having a network structure may be selected from a compound represented by the following Formula E.

[Formula E]

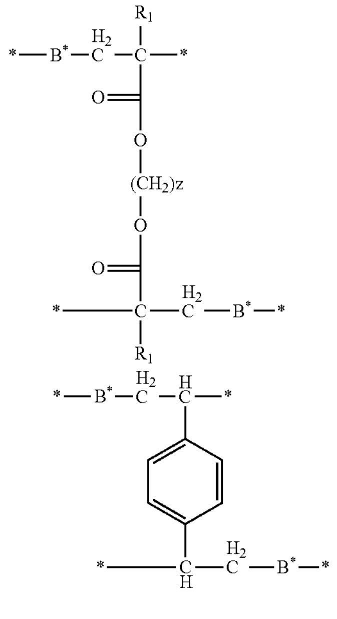

-continued

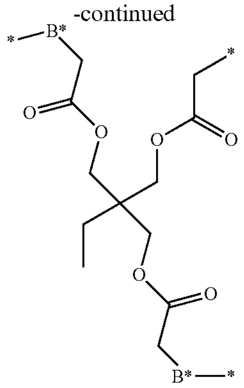

In Formula E, z is an integer of 1 to 10 or 1 to 6 and R1 may be independently selected from hydrogen or a methyl group.

In Formula E, B' is a polymer including one or more repeating units selected from the above-mentioned Formula B. That is, in Formula E, B' may be a homopolymer constituted with one repeating unit selected from Formula B or a copolymer including one or more repeating units.

The first interfacial crosslinked layers 120*a* and 120*b* are located between the first polymer layer 110 and the second polymer layers 130*a* and 130*b*. The first interfacial crosslinked layers 120*a* and 120*b* are layers formed by the first polymer of the first polymer layer 110 and the second polymer of the second polymer layer which are crosslinked at the interface at which the first polymer layer 110 and the second polymer layers 130*a* and 130*b* are in contact with each other. This will be described in more detail below.

The first interfacial crosslinked layers 120*a* and 120*b* include a first crosslinked polymer having a network structure in which the first polymer of the first polymer layer 110 and the second polymer of the second polymer layer are crosslinked. As described above, the first polymer of the first polymer layer 110 and the second polymer of the second polymer layers 130*a* and 130*b* are crosslinked at the interface at which the first polymer and the second polymer are in contact with each other to form a network structure. Therefore, the first polymer layer 110 and the second polymer layers 130*a* and 130*b* may be bonded to each other without having a separate adhesive member.

Generally, since in the single layered film, the stiffness and the softness have a trade-off relationship, when a crosslinking density is increased to increase the stiffness, the softness is lowered so that it is difficult to increase the stiffness while maintaining the softness to be high. The flexible substrate 100 according to the present disclosure includes the first polymer layer 110 having an excellent stiffness and the second polymer layers 130*a* and 130*b* having an excellent softness and the first crosslinked polymer. The first crosslinked polymer has a network structure in which the first polymer and the second polymer are crosslinked at an interface at which the first polymer layer and the second polymer layers are crosslinked. By doing this, the stiffness may be significantly improved while maintaining the softness to be high. Further, the first polymer layer 110 and the second polymer layers 130*a* and 130*b* having different polymers are not in physically contact with each other, but the first polymer and the second polymer are crosslinked to form a chemical bond so that a peeling strength is excellent. Therefore, when the flexible substrate 100 of the present disclosure is used as a substrate for the foldable display device, the folding characteristic is excellent and the deformation of the substrate, peeling between layers, or slip during the folding may be minimized.

For example, the first crosslinked polymer may be selected from a compound represented by the following Formula C.

[Formula C]

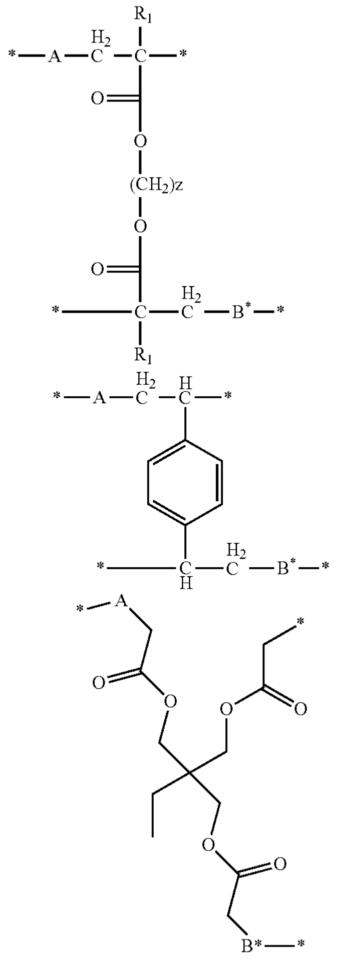

In Formula C, z is an integer of 1 to 10 and R1 may be independently selected from hydrogen or a methyl group.

In Formula C, A may be a homopolymer constituted with one repeating unit selected from the above-described Formula A or a copolymer including one or more repeating units. That is, in Formula C, A is a polymer which is the same as the first polymer of the first polymer layer 110.

In Formula C, B' may be a homopolymer constituted with one repeating unit selected from the above-described Formula B or a copolymer including one or more repeating units. That is, in Formula C, B' is a polymer which is the same as the second polymer of the second polymer layers 130*a* and 130*b*.

The adhesive layers 150*a* and 150*b* are located on an uppermost portion and a lowermost portion of the flexible substrate 100. That is, the adhesive layers 150*a* and 150*b* are located above the second polymer layer 120*a* located above the first polymer layer 110 and below the second polymer layer 120*b* located below the first polymer layer 110, respectively. However, it is not limited thereto and the adhesive layers 150*a* and 150*b* may be omitted if necessary and may be disposed only on the uppermost portion or the lowermost portion.

The adhesive layers 150*a* and 150*b* include a third polymer. The third polymer may be a polymer which has an adhesive property and form a crosslinking bond with the second polymer of the second polymer layers 130*a* and 130*b*.

For example, the third polymer includes a side chain capable of imparting an adhesive force, and the side chain may be a group containing a hydroxyl group or a group such as ethyl acrylate or butyl acrylate.

For example, the third polymer may be a polymer including one or more repeating units selected from the following Formula F. That is, the third polymer may be a homopolymer constituted with one repeating unit selected from the following Formula F or a copolymer including one or more repeating units.

[Formula F]

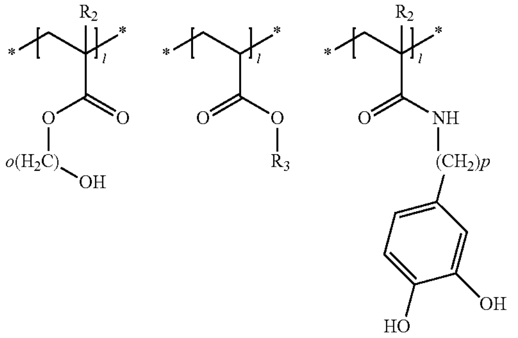

In Formula F, R2 is independently hydrogen or a methyl group, R3 is an alkyl group having 1 to 10 or 1 to 4 carbon atoms, o is an integer of 1 to 10, p is an integer of 1 to 10 or 1 to 4, and 1 may be each independently an integer of 500 to 3000 or 1000 to 2000.

For example, the third polymer may be selected from poly (2-hydroxyethyl methacrylate), poly (4-hydroxybutyl acrylate), poly (dopamine methacrylamide), poly ethyl acrylate, and poly butyl acrylate, but is not limited thereto.

The third polymers are crosslinked to form a network structure. For example, the third polymer having a network structure may be selected from a compound represented by the following Formula G.

[Formula G]

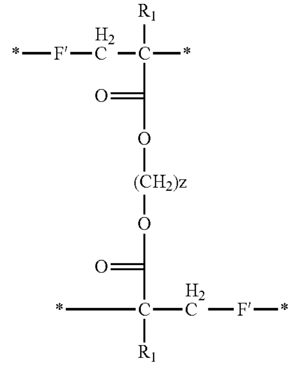

-continued

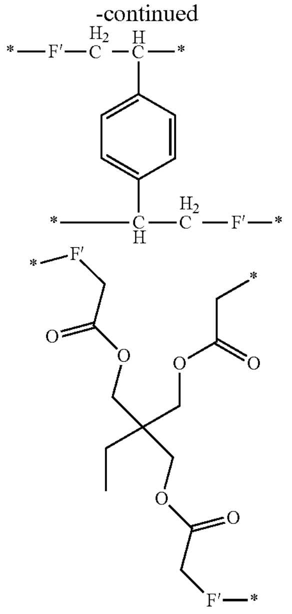

In Formula G, z is an integer of 1 to 10 or 1 to 6 and R1 may be independently selected from hydrogen or a methyl group.

In Formula G, F' may be a homopolymer constituted with one repeating unit selected from the above-described Formula F or a copolymer including one or more repeating units.

The second interfacial crosslinked layers 140*a* and 140*b* are located between the second polymer layers 130*a* and 130*b* and the adhesive layers 150*a* and 150*b*. The second interfacial crosslinked layers 140*a* and 140*b* are disposed between the second polymer layer 130*a* and the adhesive layer 150*a* which are located above the first polymer layer 110 and between the second polymer layer 130*b* and the adhesive layer 150*b* which are located below the first polymer layer 110, respectively.

The second interfacial crosslinked layers 140*a* and 140*b* are layers formed by crosslinking the second polymer of the second polymer layers 130*a* and 130*b* and the third polymers of the adhesive layers 150*a* and 150*b* at the interface at which the second polymer layers 130*a* and 130*b* and the adhesive layers 150*a* and 150*b* are in contact with each other. This will be described in more detail below.

The second interfacial crosslinked layers 140*a* and 140*b* include a second crosslinked polymer having a network structure formed by crosslinking the second polymers of the second polymer layers 130*a* and 130*b* and the third polymers of the adhesive layers 150*a* and 150*b*. As described above, the second polymer and the third polymer are crosslinked at the interface at which the second polymer and the third polymer are in contact to form the network structure. Therefore, the second polymer layers 130*a* and 130*b* and the adhesive layers 150*a* and 150*b* may be bonded to each other with a higher peeling strength. Therefore, when the flexible substrate 100 of the present disclosure is used as a substrate for the foldable display device, the folding characteristic is excellent and the deformation of the substrate, peeling between layers, or slip during the folding may be minimized.

For example, the second crosslinked polymer may be selected from a compound represented by the following Formula H.

[Formula H]

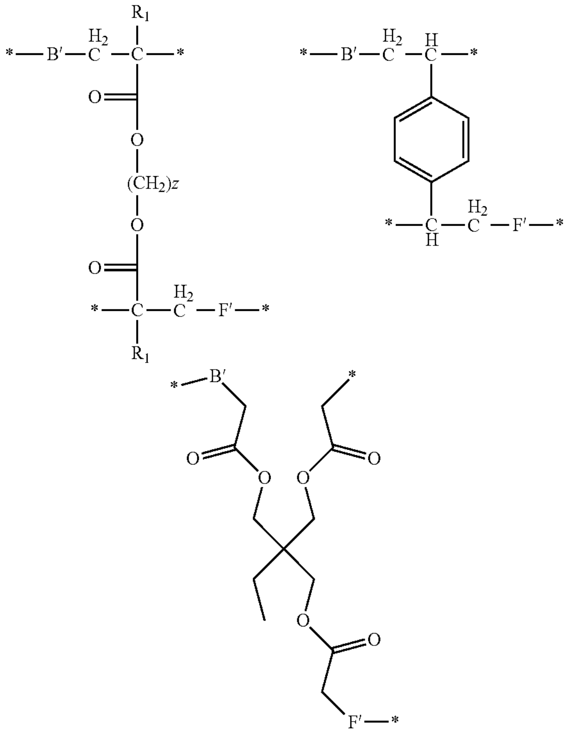

In Formula H, z is an integer of 1 to 10 or 1 to 6 and R1 may be independently selected from hydrogen or a methyl group.

In Formula H, B' may be a homopolymer constituted with one repeating unit selected from the above-described Formula B or a copolymer including one or more repeating units. That is, in Formula H, B' is a polymer which is the same as the second polymer of the second polymer layers 130*a* and 130*b*.

In Formula H, F' may be a homopolymer constituted with one repeating unit selected from the above-described Formula F or a copolymer including one or more repeating units. That is, in Formula H, F' is a polymer which is the same as the third polymer of the adhesive layers 150*a* and 150*b*.

The first interfacial crosslinked layers 120*a* and 120*b*, the second polymer layers 130*a* and 130*b*, the second interfacial crosslinked layers 140*a* and 140*b*, and the adhesive layers 150*a* and 150*b* are laminated to have a symmetrical structure with respect to the first polymer layer 110.

Hereinafter, a configuration and an effect of a flexible substrate according to the exemplary aspect of the present disclosure will be described in more detail with reference to FIGS. 2 and 3 together.

Figure 2:
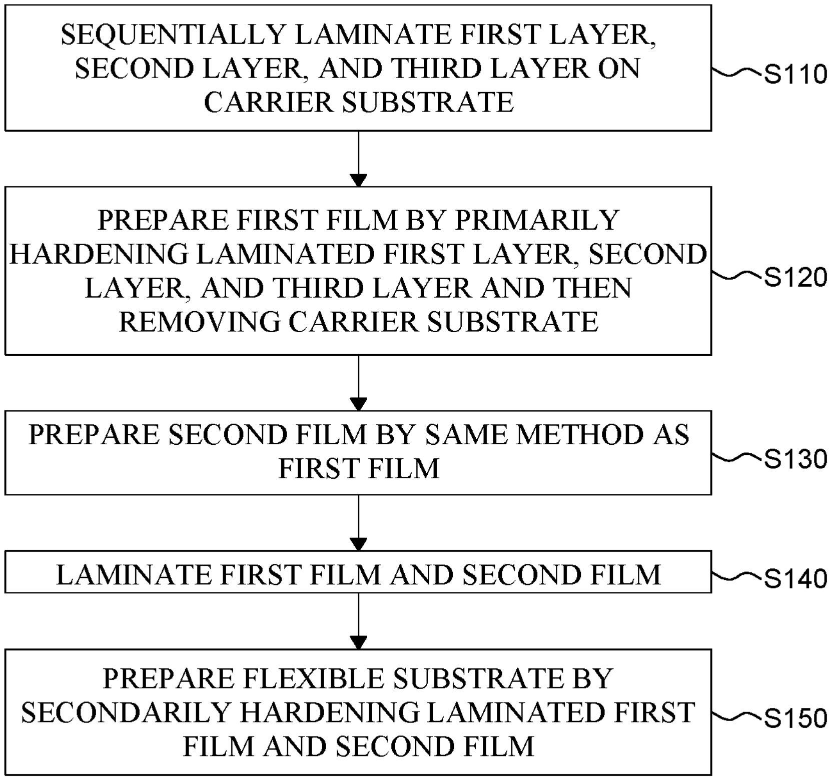
FIG. 2 is a flowchart for explaining a preparing method of a flexible substrate according to an exemplary aspect of the present disclosure.
Figure 3:
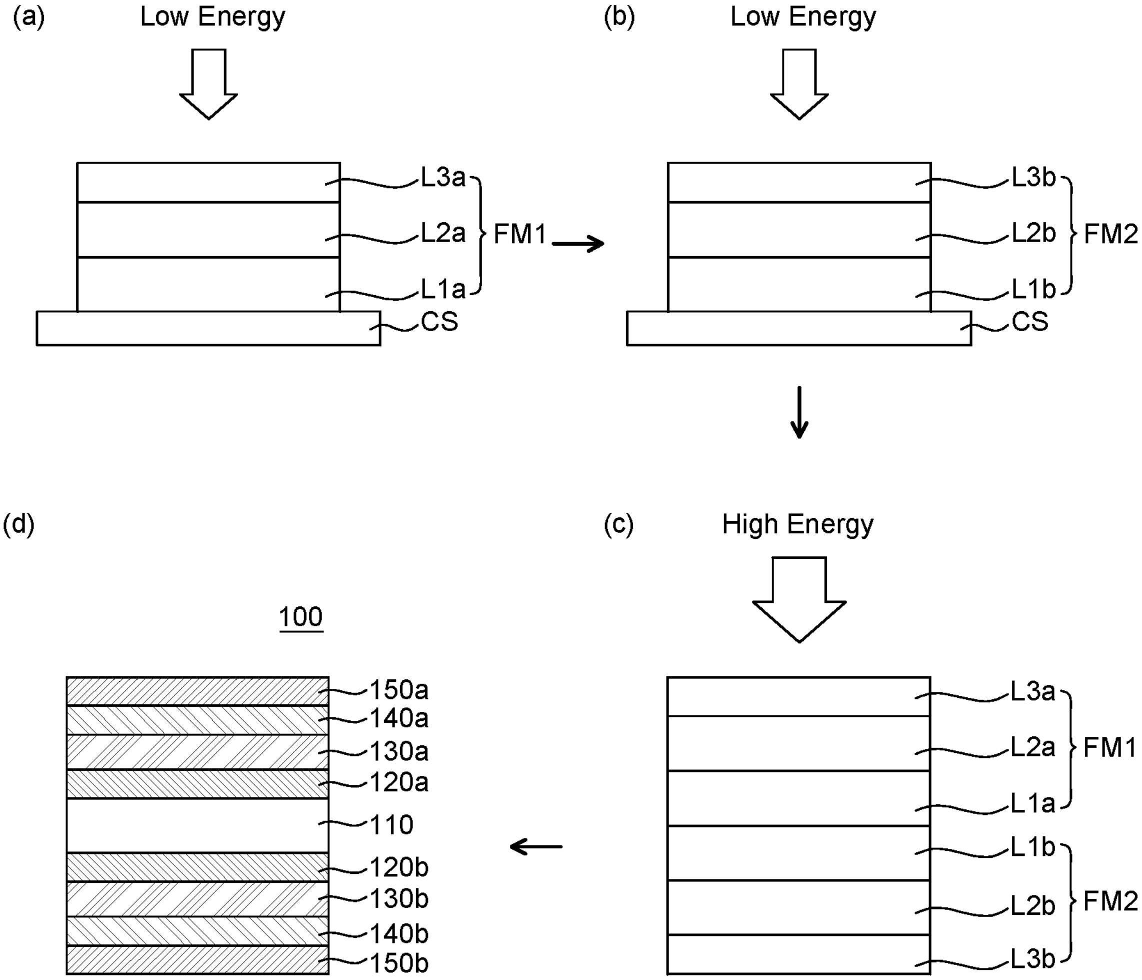
FIG. 3 is a cross-sectional view for explaining a preparing method of a flexible substrate according to an exemplary aspect of the present disclosure.

FIG. 2 is a flowchart for explaining a preparing method of a flexible substrate according to an exemplary aspect of the present disclosure. FIG. 3 is a schematic cross-sectional view for explaining a preparing method of a flexible substrate according to an exemplary aspect of the present disclosure.

A preparing method of the flexible substrate 100 according to the exemplary aspect of the present disclosure includes a step S110 of sequentially laminating a first layer L1*a*, a second layer L2*a*, and a third layer L3*a* on a carrier substrate CS, a step S120 of preparing a first film FM1 by primarily hardening the laminated first layer L1*a*, second layer L2*a*, and third layer L3*a*, and then removing the carrier substrate CS, a step S130 of preparing a second film FM2 by the same method as the first film FM1, a step S140 of laminating the first film FM1 and the second film FM2, and a step S150 of preparing a flexible substrate 100 by secondarily hardening the laminated first film FM1 and second film FM2. Hereinafter, steps of the preparing method of a flexible substrate will be described in detail.

First, the first layer L1*a*, the second layer L2*a*, and the third layer L3*a* are sequentially laminated on the carrier substrate CS (S110).

In order to form the individual layers, a first polymer solution containing a first monomer, a crosslinking agent, and an initiator, a second polymer solution containing a second monomer, a crosslinking agent, and an initiator, and a third polymer solution containing a third monomer, a crosslinking agent, and an initiator are prepared.

The first monomer is polymerized to form a first polymer. For example, the first monomer may be one or more compounds selected from compounds represented by the following Formula A-1.

[Formula A-1]

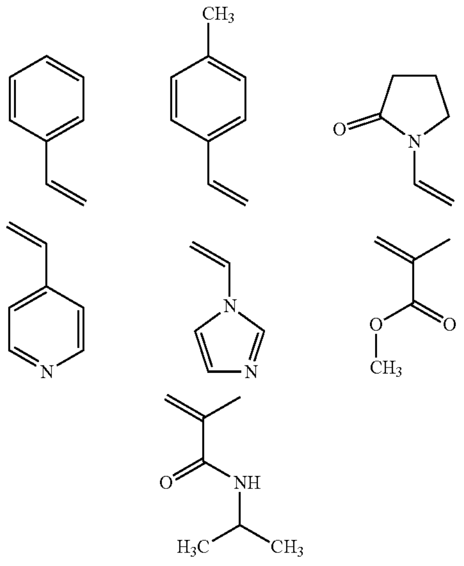

The second monomer is polymerized to form a second polymer. For example, the second monomer may be one or more compounds selected from compounds represented by the following Formula B-1.

[Formula B-1]

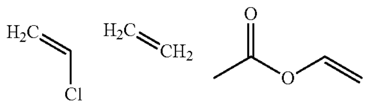

The third monomer is polymerized to form a third polymer. For example, the third monomer may be one or more compounds selected from the following Formula F-1.

[Formula F-1]

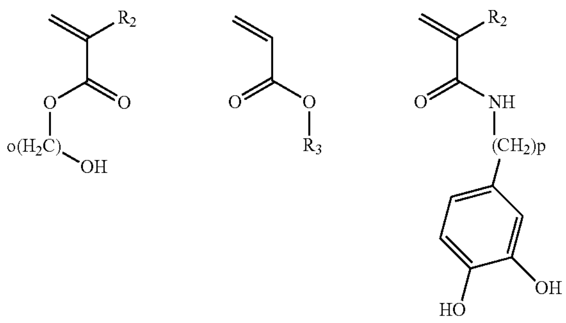

In Formula F-1, R2 is independently hydrogen or a methyl group, R3 is an alkyl group having 1 to 10 or 1 to 4 carbon atoms, o is an integer of 1 to 10, p may be an integer of 1 to 10 or 1 to 4.

Each of the first monomer, the second monomer, and the third monomer includes an unsaturated group and the crosslinking agent may be a compound containing two or more unsaturated groups capable of being polymerized with these monomers. Therefore, polymers formed from the monomer by the reaction of the monomer and the crosslinking agent may be crosslinked to have a network structure.

For example, the crosslinking agent may be one or more compounds selected from compounds represented by the following Formula X.

[Formula X]

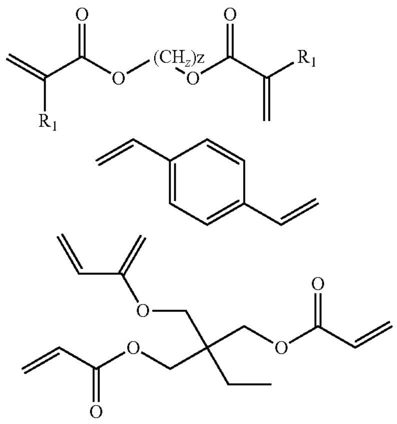

In Formula X, R1 is independently selected from hydrogen or a methyl group and z may be an integer of 1 to 10 or 1 to 6.

The initiator may use a compound which may form free radicals when light is irradiated. For example, as the initiator, 2,2-dimethoxy-1,2-diphenylethan-1-one, 2-hydroxy-2-methyl-1-phenylpropanone, or the like may be used, but is not limited thereto.

After preparing the polymer solution, the first polymer solution is applied on the carrier substrate CS and simply dried to form the first layer L1*a*.

Unless otherwise specified, the polymer solution may be applied on the carrier substrate (CS) by a method known in the art, such as bar coating or dip coating. After applying the first polymer solution, light is irradiated to simply harden the first polymer solution to form the first layer L1*a*.

The second polymer solution is applied on the first layer L1*a* and is simply hardened to form the second layer L2*a*. The second polymer solution may be applied and simply hardened by the same method as the first layer L1*a*.

The third polymer solution is applied on the second layer L2*a* and is simply hardened to form the third layer L3*a*. The third polymer solution may be applied and simply hardened by the same method as the first layer L1*a*.

As the second layer La2 and the third layer La3 are sequentially laminated on the first layer L1*a*, the number of exposures to the light is gradually reduced from the first layer L1*a* to the third layer L3*a*. Therefore, the hardness is reduced from the first layer L1*a* to the third layer L3*a* so that a mechanical property gradient may be exhibited. Accordingly, the degree of hardening is different from the first polymer layer 110 of the finally prepared flexible substrate 100 to the adhesive layers 150*a* and 150*b*, so that a modulus gradient and a stiffness gradient may be exhibited.

Next, the first film FM1 is prepared by primarily hardening the laminated first layer L1*a*, second layer L2*a*, and third layer L3*a* and then removing the carrier substrate CS (S120).

The primary hardening is performed by irradiating light on the laminated first layer L1*a*, second layer L2*a*, and third layer L3*a*. The first layer L1*a*, the second layer L2*a*, and the third layer L3*a* are simultaneously hardened. In the primary hardening step, light having an energy lower than that of light which is irradiated in the secondary hardening step to be described below is irradiated to harden the layers. That is, in the primary hardening step, light having a first energy is irradiated to perform the hardening and in the secondary hardening step to be described below, light having a second energy higher than the first energy is irradiated to perform the hardening.

For example, the light having the first energy may have a wavelength longer than that of the light having the second energy. As another example, the light having the first energy and the light having the second energy have the same wavelength, but have different outputs.

When the light having the first energy is irradiated on the laminated first layer L1*a*, second layer L2*a*, and third layer L3*a*, the polymer corresponding to each layer is formed by polymerization of the monomer. At this time, the first polymers are crosslinked by the crosslinking agent included in the first layer L1*a* to form the network structure. For example, the first polymer having a network structure may be selected from a compound represented by the above-described Formula D. The first polymer imparts the stiffness to the flexible substrate 100 and may increase a crosslinking density by increasing a concentration of the crosslinking agent when the first polymer solution is prepared to further improve the stiffness while maintaining the softness to be high.

Further, in the second layer L2*a*, the second polymer is formed by polymerization of the second monomer and the second polymers are crosslinked by the crosslinking agent to form a network structure. For example, the second polymer having a network structure may be selected from a compound represented by the above-described Formula E.

Further, in the third layer L3*a*, the third polymer may be formed by polymerization of the third monomer and the third polymers are crosslinked by the crosslinking agent to form a network structure. For example, the third polymer having a network structure may be selected from a compound represented by the above-described Formula G.

In the primary hardening step, light having the first energy which is relatively low is irradiated to harden the polymer formed for every layer to have a polymerization conversion rate of 70% to 80%. Therefore, each layer may include unreacted monomers and crosslinking agents in addition to the polymers. That is, the first layer L1*a* includes a first polymer, a first monomer, and a crosslinking agent, the second layer L2*a* includes a second polymer, a second monomer, and a crosslinking agent, and the third layer L3*a* may include a third polymer, a third monomer, and a crosslinking agent.

After completing the primary hardening, the carrier substrate CS is removed to prepare the first film FM1.

Next, the second film FM2 is prepared (S130).

The second film FM2 may be prepared by sequentially laminating the first layer L1*b*, the second layer L2*b*, and the third layer L3*b* on the carrier substrate CS and then removing the carrier substrate CS. The second film FM2 is prepared by the same process as the first film FM1 described above, so that a redundant description will be omitted.

If necessary, selectively in the step of preparing the first film FM1, the step of preparing the second film FM2, or in both steps, a process of applying the third polymer solution to form the third layers L3*a* and L3*b* may be omitted.

Next, the first film FM1 and the second film FM2 are laminated (S140).

The first film FM1 and the second film FM2 are laminated such that the first layer L1*a* of the first film FM1 and the first layer L1*b* of the second film FM2 are opposite to each other.

Next, the first film and the second film FM2 which are laminated are secondarily hardened to prepare the flexible substrate 100 (S150).

The second hardening is performed by irradiating light on the laminated first film FM1 and second film FM2. The first film FM1 and the second film FM2 are simultaneously hardened. As described above, in the secondary hardening step, light having the second energy higher than the first energy is irradiated to perform the additional hardening. In the second hardening step, interfacial polymerization is performed. For example, at the interface at which the first layer L1*a* of the first film FM1 and the first layer L1*b* of the second film FM2 are in contact with each other, the first film FM1 and the second film FM2 are bonded by the crosslinking reaction between the first polymer of the first film FM1 and the first polymer of the second film FM2.

Further, at the interface at which the first layer L1*a* and the second layer L2*a* of the first film FM1 are in contact with each other, a first interfacial crosslinking layer 120*a* including the first crosslinked polymer is formed by the crosslinking reaction of the first polymer of the first layer L1*a* and the second polymer of the second layer L2*a*. For example, the first crosslinked polymer may be selected from a compound represented by the above-described Formula C. As the first polymer of the first layer L1*a* and the second polymer of the second layer L2*a* are crosslinked, the first layer L1*a* and the second layer L2*a* are bonded to each other.

Further, at the interface at which the second layer L2*a* and the third layer L3*a* of the first film FM1 are in contact with each other, a second interfacial crosslinking layer 140*a* including the second crosslinked polymer is formed by the crosslinking reaction of the second polymer of the second layer L2*a* and the third polymer of the third layer L3*a*. For example, the second crosslinked polymer may be selected from a compound represented by the above-described Formula H. As the second polymer of the second layer L2*a* and the third polymer of the third layer L3*a* are crosslinked, the second layer L2*a* and the third layer L3*a* are bonded to each other.

In the first layer L1*b* and the second layer L2*b* of the second film FM2, similarly to the first film FM1, a first interface crosslinking layer 120*b* is formed at the interface of the first layer L1*b* and the second layer L2*b* by the crosslinking reaction. Further, similarly to the first film FM1, the second interface crosslinked layer 140*b* is formed at the interface of the second layer L2*b* and the third layer L3*b* of the second film FM2 so that a redundant description will be omitted.

As in the second hardening step, the light having the second energy is irradiated to perform additional hardening, the polymerization conversion rate of the polymer included in each layer is higher than that of the first hardening step, and for example, may be 90% to 99.9%.

In the second hardening step, light having the second energy which is a relatively high energy is irradiated so that the polymerization reaction occurs at the interface of each layer and the first film FM1 and the second film FM2 are integrally bonded by the crosslinking between the polymers included in different layers. Further, the first interfacial crosslinked layers 120*a* and 120*b* are formed at the interface of the first layers L1*a* and L2*a* and the second layers L2*a* and L2*b* in each of the first film FM1 and the second film FM2, and the second interfacial crosslinked layers 140*a* and 140*b* are formed between the second layers L2*a* and L2*b* and the third layers L3*a* and L3*b*. Finally, the flexible substrate 100 having a structure in which the first interfacial crosslinked layers 120*a* and 120*b*, the second polymer layers 130*a* and 130*b*, the second interfacial crosslinked layers 140*a* and 140*b*, and the adhesive layers 150*a* and 150*b* are symmetrically laminated above and below the first polymer layer 110 and each layer is integrated may be obtained.

The first layers L1*a* and L1*b* include a polymer having an excellent stiffness and the second layer L2*a* and L2*b* include a polymer having an excellent softness, and the third layers L3*a* and L3*b* include a polymer which provides an adhesiveness. Accordingly, the flexible substrate 100 obtained by simultaneously secondarily hardening the first layers L1*a* and L2*b*, the second layers L2*a* and L2*b*, and the third layers L3*a* and L3*b* may satisfy both the softness and the stiffness.

Further, in the flexible substrate of the related art, it is difficult to handle the adhesive layer during the process of laminating the adhesive layer on the substrate. Specifically, the adhesive layer had a relatively low modulus to provide adhesiveness and residual adhesive was easily occurred during the process of punching the adhesive layer to have a desired shape and size due to its high decorative property. However, the flexible substrate 100 of the present disclosure does not require a process of punching and laminating the adhesive layer, so that it has a process advantage.

The flexible substrate 100 of the present disclosure has an adhesiveness with excellent stiffness and softness so that the flexible substrate may be used as a substrate for supporting the display panel. Further, the flexible substrate 100 of the present disclosure is used as the substrate of the foldable display device to provide a display device with an improved impact resistance while maintaining the high folding characteristic.

Figure 4:
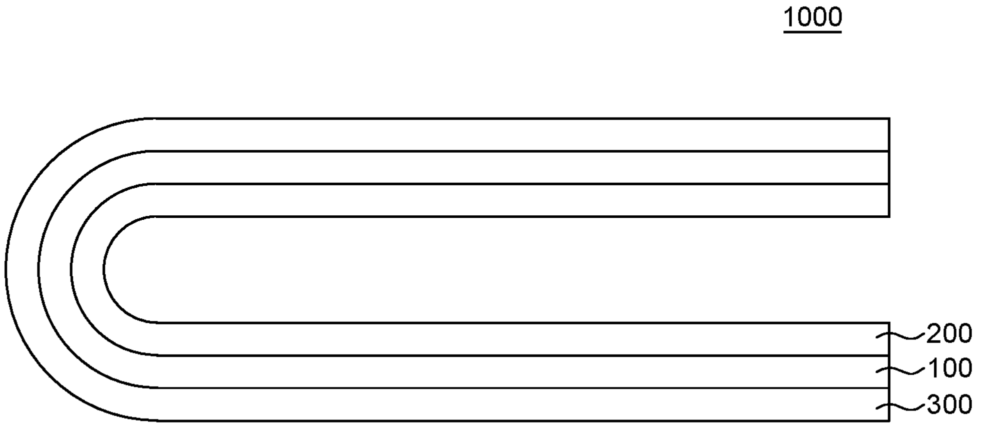
FIG. 4 is a cross-sectional view of a display device according to an exemplary aspect of the present disclosure.

Hereinafter, a display device according to an exemplary aspect of the present disclosure will be described with reference to FIG. 4. FIG. 4 is a schematic cross-sectional view of a display device according to an exemplary aspect of the present disclosure. Even though in FIG. 4, for the convenience of description, it is illustrated that the display device is a foldable display device, it is not limited thereto. The display device of the present disclosure may be implemented not only as a flat display device, but also as a display device having various shapes such as curved or multi-folding display devices.

Referring to FIG. 4, the display device 100 according to the exemplary aspect of the present disclosure includes a support plate 300, a flexible substrate 100, and a display panel 200. In the display device of FIG. 4, the flexible substrate 100 is the same as the flexible substrate 100 illustrated in FIG. 1 so that a redundant description will be omitted.

The display panel 200 is a panel which displays images. For example, the display panel 200 may be an organic light emitting display panel including an organic light emitting diode, but is not limited thereto.

For example, the organic light emitting diode may include an anode, a cathode, and an organic light emitting layer disposed therebetween. In the organic light emitting diode, holes injected from the anode and electrons injected from the cathode are coupled on the organic light emitting layer to emit light. The image may be displayed using the light emitted as described above.

Referring to FIGS. 1 and 4, the flexible substrate 100 is disposed on the rear surface of the display panel 200. The flexible substrate 100 supports various elements which configure the display panel 200 and is referred to as a back plate. The flexible substrate 100 includes a first polymer layer 110 having an excellent stiffness, second polymer layers 130*a* and 130*b* having an excellent softness, and a first interfacial crosslinked layers 120*a* and 120*b* having a network structure in which the first polymer and the second polymer are crosslinked between the first polymer layer and the second polymer layer. Therefore, the stiffness and the softness are simultaneously satisfied. The flexible substrate is disposed on the rear surface of the display panel 200 to ensure the impact resistance while maintaining the folding characteristic of the display device 1000 to be high. By doing this, the display panel 200 may be easily folded and may be protected from the external impact.

The adhesive layers 150*a* and 150*b* are located above and below the flexible substrate 100. The display panel 200 may be bonded onto the flexible substrate 100 by the adhesive layer 150*a* which is located above the flexible substrate 100.

The display device which is implemented to be foldable is configured by materials having a high softness to easily perform the folding. Therefore, when the display device is folded, it is difficult to maintain a predetermined shape and is vulnerable to the external stimulation.

Therefore, the support plate 300 may be disposed below the flexible substrate 100. The support plater 300 may be referred to as a plate assembly. The support plate 300 is bonded onto the rear surface of the flexible substrate 100 by the adhesive layer 150*b* located below the flexible substrate 100.

The support plate 300 may include a plate top and a plate bottom. If necessary, the plate top and the plate bottom may be selectively integrally formed and if necessary, the plate top or the plate bottom may be omitted.

The plate bottom may include an opening pattern in a part corresponding to the folding area of the display device. By doing this, the folding stress may be effectively relieved while maintaining the stiffness of the display device to be high.

For example, the plate bottom may be a metal material such as stainless steel (SUS) or invar. However, the plate bottom is not limited thereto and may be a plastic material such as polymethylmethacrylate (PMMA), polycarbonate (PC), polyvinylalcohol (PVA), acrylonitrile-butadiene-styrene (ABS), polyethylene terephthalate (PET), silicone, or polyurethane (PU).

The plate top is disposed between the flexible substrate 100 and the plate bottom. The plate top is formed of a material having a high stiffness to enhance the stiffness of the display device. Further, the plate top may suppress a phenomenon that the opening pattern of the plate bottom is visible through the display panel 200. For example, the plate top may be formed of a metal material such as stainless steel (SUS), invar, an aluminum based material or magnesium. However, the plate top is not limited thereto and may be formed of plastic material such as polymethylmethacrylate (PMMA) or polycarbonate (PC).

The display device according to the exemplary aspect of the present disclosure includes a flexible substrate which includes an interfacial crosslinked layer having a network structure in which heterogeneous polymers are crosslinked at an interface where a layer containing a polymer having an excellent softness and a layer containing a polymer having an excellent stiffness are in contact to significantly improve the stiffness while maintaining a high softness. The flexible substrate is disposed on the rear surface of the display panel to allow the display device to be easily folded and improve the impact resistance to protect the display device from the external impact.

The exemplary aspects of the present disclosure can also be described as follows:

According to an aspect of the present disclosure, a flexible substrate comprises a first polymer layer including a first polymer, second polymer layers which include second polymers and are located above and below the first polymer layer, and first interfacial crosslinked layers which are located between the first polymer layer and the second polymer layers and include a first crosslinked polymer having a network structure in which the first polymer and the second polymer are crosslinked, wherein a stiffness of the first polymer layer is larger than a stiffness of the second polymer layers and a softness of the second polymer layer is larger than a softness of the first polymer layer.

The first polymer may include one or more repeating units selected from the following Formula A and the second polymer may include one or more repeating units selected from the following Formula B.

[Formula A]

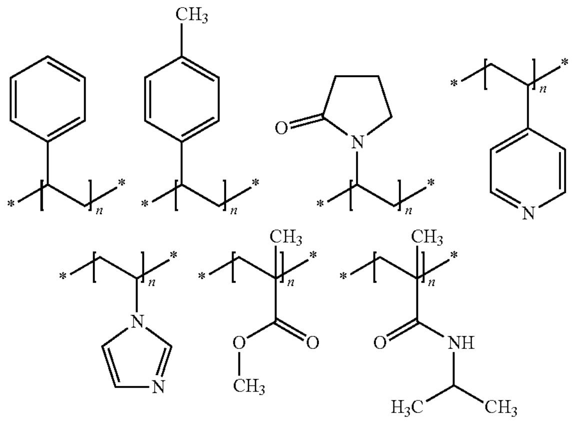

[Formula B]

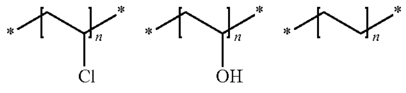

-continued

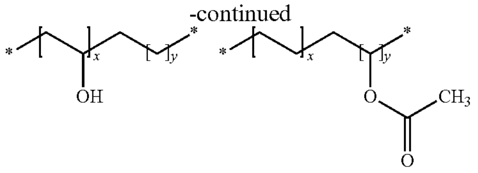

(In Formula A and Formula B, n may be independently an integer of 500 to 4000, x may be independently an integer of 300 to 2500, and y may be independently an integer of 300 to 2500)

The first crosslinked polymer may be selected from a compound represented by the following Formula C.

[Formula C]

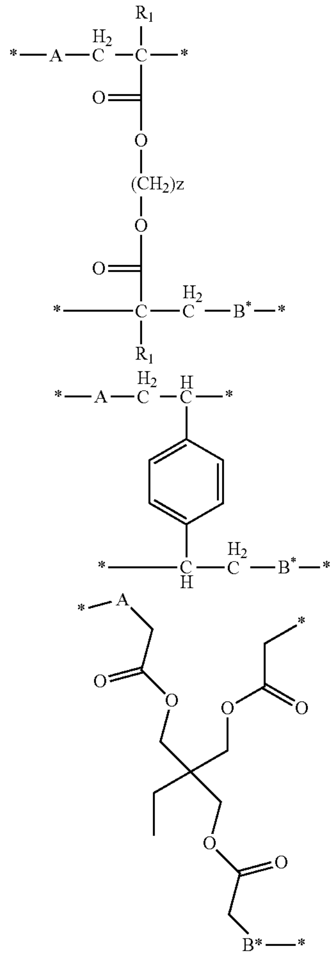

(In Formula C, z may bean integer of 1 to 10, R1 may be independently selected from hydrogen or a methyl group, A may include one or more repeating units selected from Formula A, and B' may include one or more repeating units selected from Formula B.)

The first polymers of the first polymer layer may be crosslinked to form a network structure and the second polymers of the second polymer layer may be crosslinked to form a network structure.

The first polymer having the network structure may be selected from a compound represented by the following Formula D.

[Formula D]

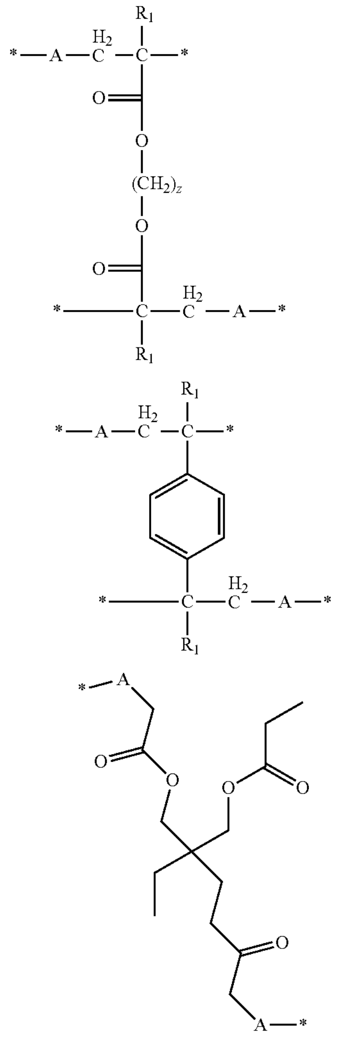

(In Formula D, A may include one or more repeating units selected from Formula A, z may be an integer of 1 to 10, R1 may be independently selected from hydrogen or a methyl group)

[Formula A]

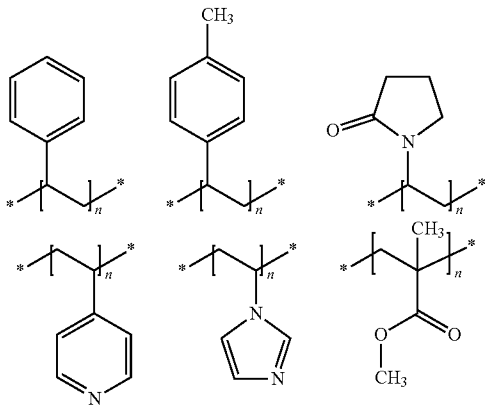

-continued

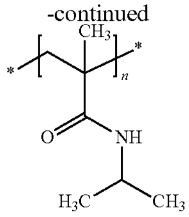

(In Formula A, n may be independently an integer of 500 to 4000.)

The second polymer having the network structure may be selected from a compound represented by the following Formula E.

[Formula E]

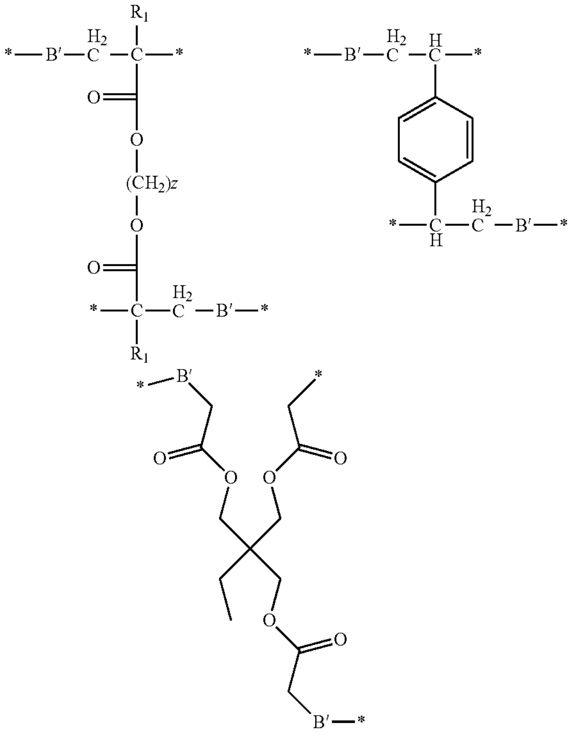

(In Formula E, B' may include one or more repeating units selected from Formula B, z may be an integer of 1 to 10, R1 may be independently selected from hydrogen or a methyl group.)

[Formula B]

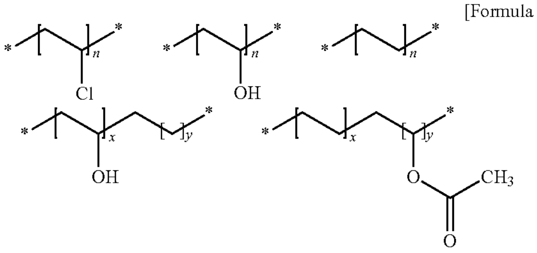

(In Formula B, n may be independently an integer of 500 to 4000, x may be independently an integer of 300 to 2500, and y may be independently an integer of 300 to 2500)

The flexible substrate may further comprise adhesive layers which are located above the second polymer layer located above the first polymer layer and below the second polymer layer located below the first polymer layer and include a third polymer.

The third polymer may include one or more repeating units selected from the following Formula F.

[Formula F]

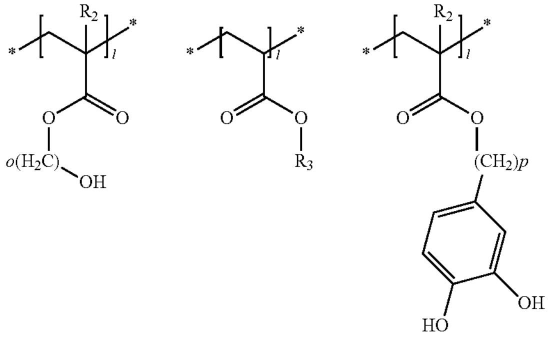

(In Formula F, R2 may be independently hydrogen or a methyl group, R3 may be an alkyl group having 1 to 10 carbon atoms, o may be an integer of 1 to 10, p may be an integer of 1 to 10, and 1 may be independently an integer of 500 to 3000.)

The third polymers of the adhesive layer may be crosslinked with each other to form a network structure and the third polymer having the network structure may be selected from a compound represented in the following Formula G.

[Formula G]

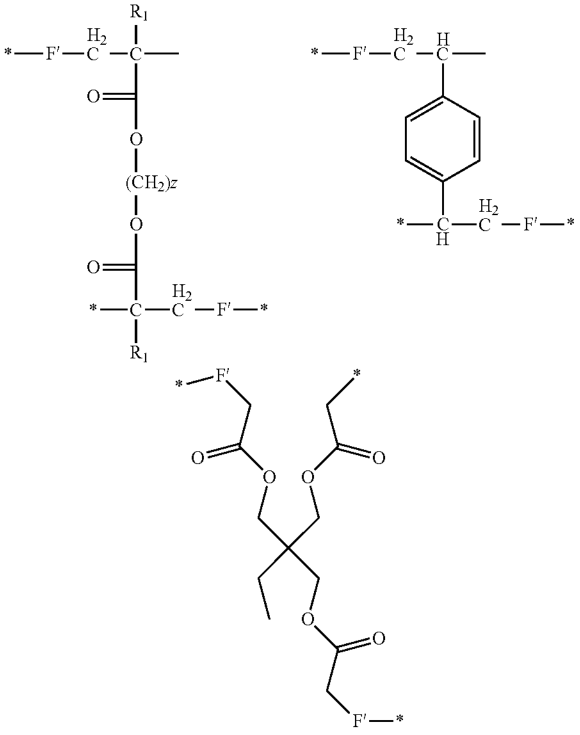

(In Formula G, F' may include one or more repeating units selected from Formula F, z may be an integer of 1 to 10, R1 may be independently selected from hydrogen or a methyl group)

The flexible substrate may further comprise second interfacial crosslinked layers which are located between the adhesive layer and the second polymer layers and include a second crosslinked polymer having a network structure in which the third polymer and the second polymer are crosslinked.

The second crosslinked polymer may be selected from a compound represented by the following Formula H.

[Formula H]

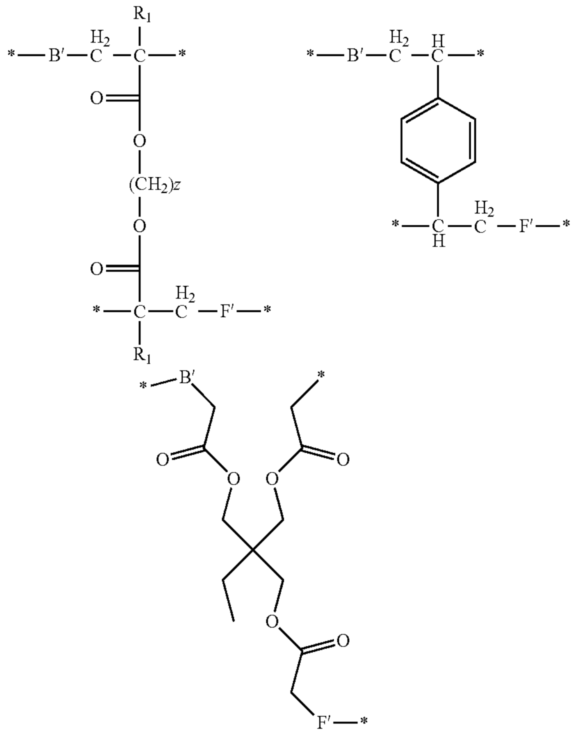

(In Formula H, B' may include one or more repeating units selected from Formula B, F' may include one or more repeating units selected from Formula F, z may be an integer of 1 to 10, R1 may be independently selected from hydrogen or a methyl group.)

[Formula B]

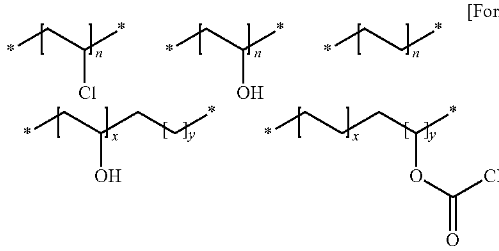

(In Formula B, n may be independently an integer of 500 to 4000, x may be independently an integer of 300 to 2500, and y may be independently an integer of 300 to 2500)

[Formula F]

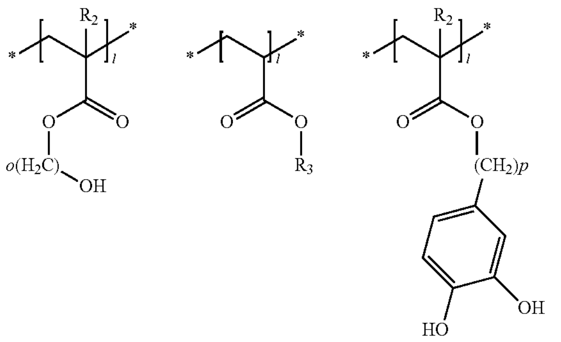

(In Formula F, R2 may be independently hydrogen or a methyl group, R3 may be an alkyl group having 1 to 10 carbon atoms, o may be an integer of 1 to 10, p is an integer of 1 to 10, and 1 may be independently an integer of 500 to 3000.)

According to another aspect of the present disclosure, a display device comprises a flexible substrate and a display panel disposed on the flexible substrate, wherein the flexible substrate includes a first polymer layer including a first polymer, second polymer layers which are located above and below the first polymer layer and include second polymers, and first interfacial crosslinked layers which are located between the first polymer layer and the second polymer layers and include a first crosslinked polymer having a network structure in which the first polymer and the second polymer are crosslinked, wherein a stiffness of the first polymer layer is larger than a stiffness of the second polymer layers and a softness of the second polymer layer is larger than a softness of the first polymer layer.

The first crosslinked polymer may be selected from a compound represented by the following Formula C.

[Formula C]

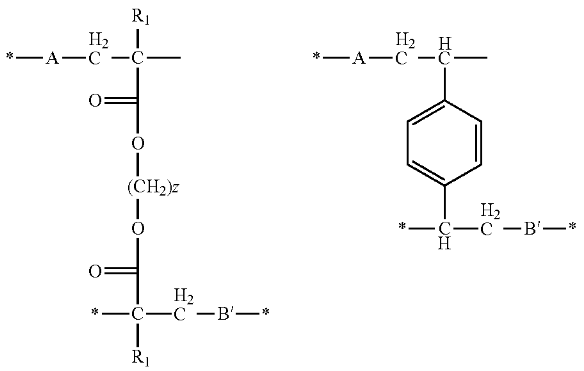

-continued

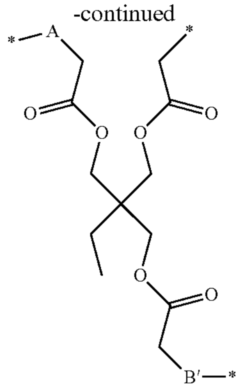

(In Formula C, z may be an integer of 1 to 10, R1 may be independently selected from hydrogen or a methyl group, A may include one or more repeating units selected from Formula A, and B' may include one or more repeating units selected from Formula B.)

[Formula A]

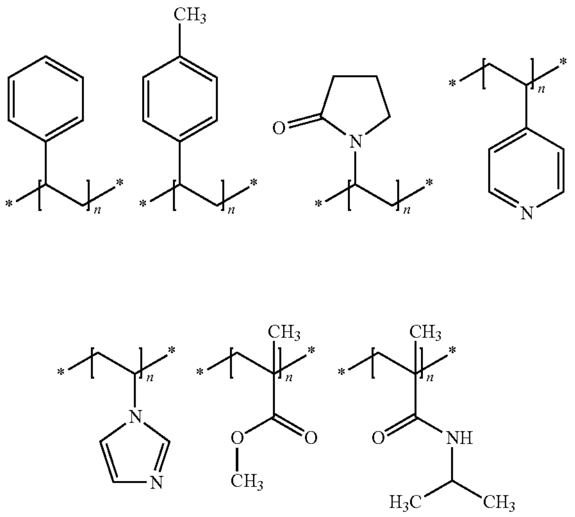

[Formula B]

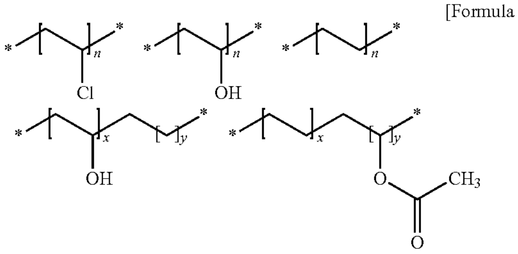

(In Formula A and Formula B, n may be independently an integer of 500 to 4000, x may be independently an integer of 300 to 2500, and y may be independently an integer of 300 to 2500)

The first polymers of the first polymer layer may be crosslinked to form a network structure and the first polymer having the network structure may be selected from a compound represented by Formula D as follows.

[Formula D]

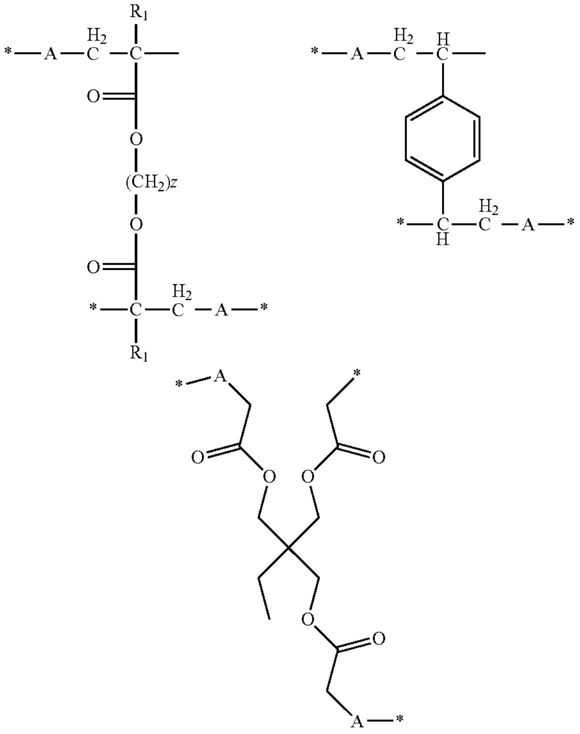

(In Formula D, A may include one or more repeating units selected from Formula A, z may be an integer of 1 to 10, and R1 may be independently selected from hydrogen or a methyl group)

[Formula A]

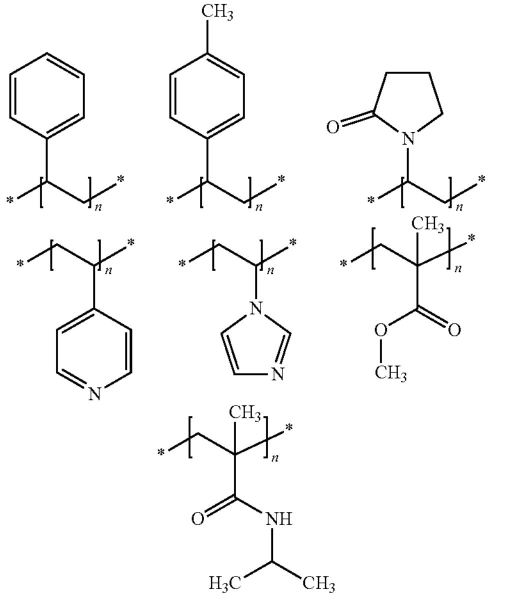

(In Formula A, n may be independently an integer of 500 to 4000.)

The second polymers of the second polymer layers may be crosslinked to form a network structure and the second polymers having the network structure may be selected from a compound represented by the following Formula E.

[Formula E]

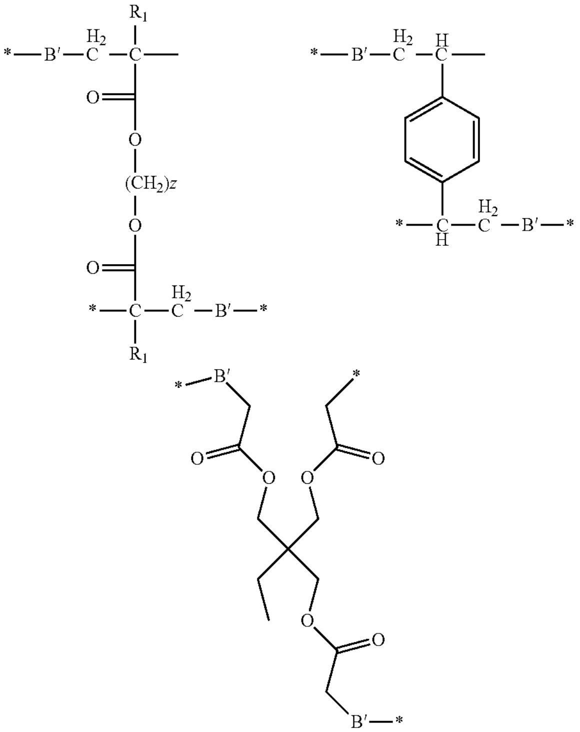

(In Formula E, B' includes one or more repeating units selected from Formula B, z may be an integer of 1 to 10, and R1 may be independently selected from hydrogen or a methyl group.)

[Formula B]

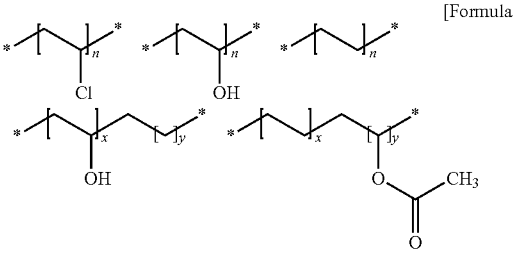

(In Formula B, n may be independently an integer of 500 to 4000, x may be independently an integer of 300 to 2500, and y may be independently an integer of 300 to 2500)

The display device further comprises adhesive layers which are located above the second polymer layer located above the first polymer layer and below the second polymer layer located below the first polymer layer and include a third polymer, and second interfacial crosslinked layers which are located between the adhesive layers and the second polymer layers and include a second crosslinked polymer having a network structure in which the third polymer and the second polymer are crosslinked.

The second crosslinked polymer may be selected from a compound represented by the following Formula H.

[Formula H]

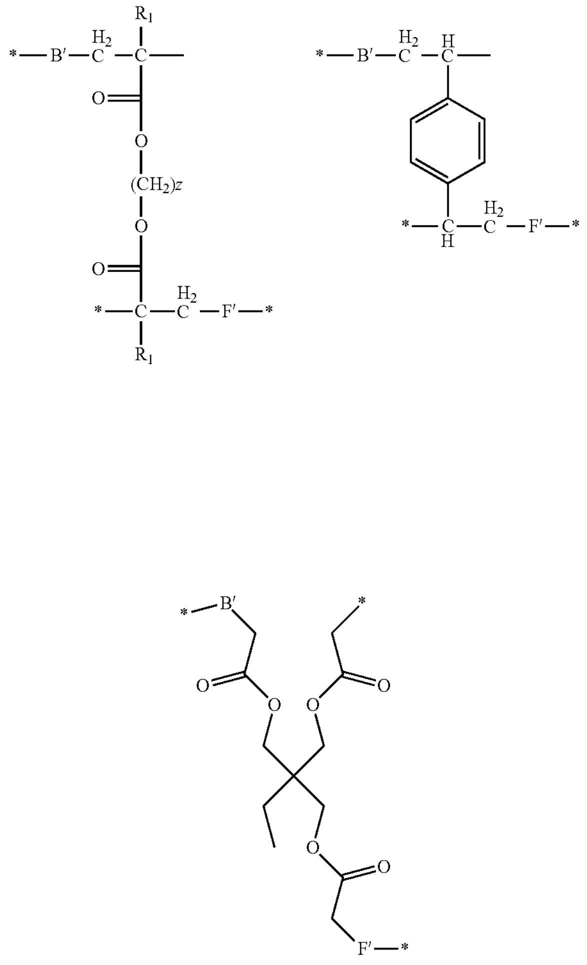

(In Formula H, B' may include one or more repeating units selected from Formula B, F' may include one or more repeating units selected from Formula F, z may be an integer of 1 to 10, R1 may be independently selected from hydrogen or a methyl group.)

[Formula B]

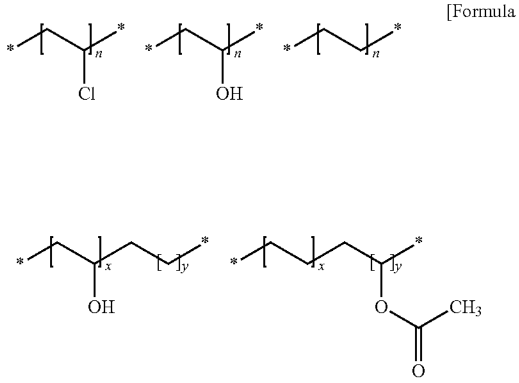

(In Formula B, n may be independently an integer of 500 to 4000, x may be independently an integer of 300 to 2500, and y may be independently an integer of 300 to 2500)

[Formula F]

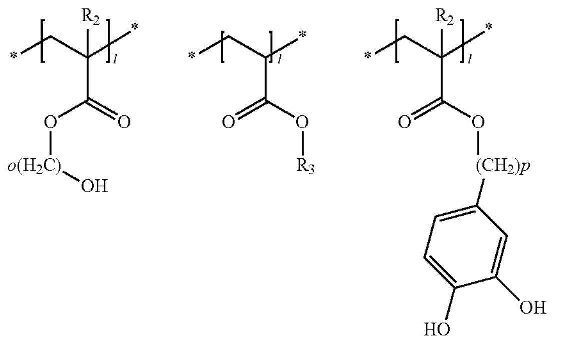

(In Formula F, R2 may be independently hydrogen or a methyl group, R3 may be an alkyl group having 1 to 10 carbon atoms, o may be an integer of 1 to 10, p may be an integer of 1 to 10, and 1 may be independently an integer of 500 to 3000.)

The third polymers of the adhesive layers may be cross-linked with each other to form a network structure and the third polymer having the network structure may be selected from a compound represented in the following Formula G.

[Formula G]

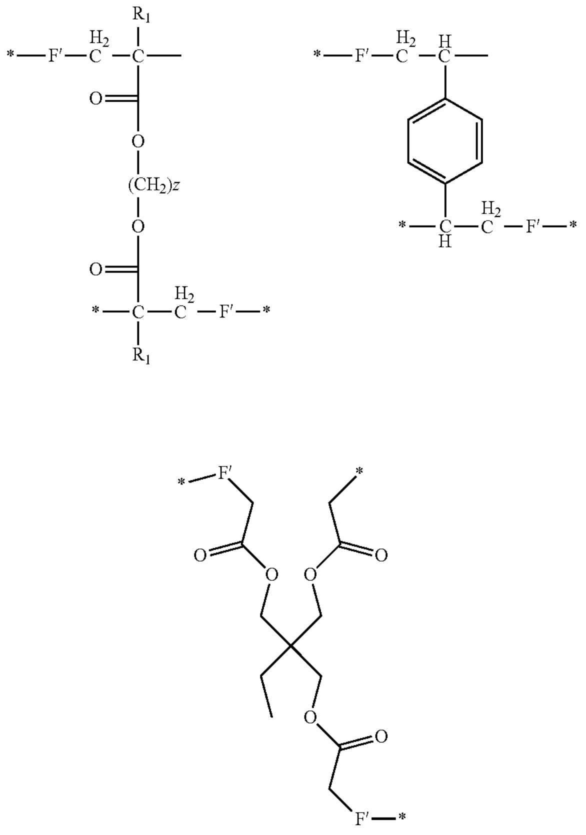

(In Formula G, F' may include one or more repeating units selected from following Formula F, z may be an integer of 1 to 10, R1 may be independently selected from hydrogen or a methyl group)

[Formula F]

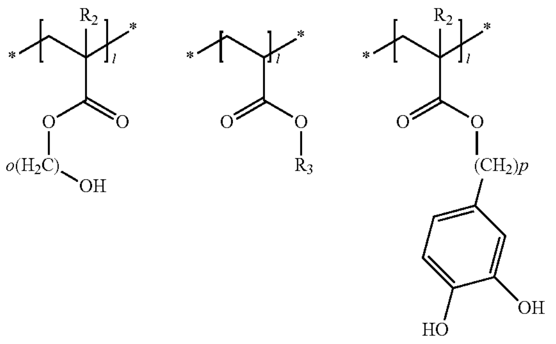

(In Formula F, R2 may be independently hydrogen or a methyl group, R3 may be an alkyl group having 1 to 10 carbon atoms, o may be an integer of 1 to 10, p is an integer of 1 to 10, and 1 may be independently an integer of 500 to 3000.)

The adhesive layer located above the second polymer layer may bond the display panel to the flexible substrate.

The display device may further comprise a support plate which is disposed below the flexible substrate, wherein the adhesive layer located below the second polymer layer may bond the support plate to the flexible substrate.

According to yet another aspect of the present disclosure, a preparing method of a flexible substrate comprise preparing a first film including a first layer including a first polymer and a crosslinking agent and a second layer including a second polymer and a crosslinking agent, preparing a second film including a first layer including a first polymer and a crosslinking agent and a second layer including a second polymer and a crosslinking agent, laminating the first film and the second film such that the first layer of the first film is opposite to the first layer of the second film, and hardening the laminated first film and second film, wherein in the hardening, the first polymer of the first film and the first polymer of the second film are crosslinked at an interface at which the first layer of the first film and the first layer of the second film are in contact with each other to form a network structure so that the first film and the second film are bonded, and the first polymer and the second polymer of the first film are crosslinked at an interface at which the first layers and the second layers are in contact with each other, to bond the first layer and the second layer of the first film, and the first polymer and the second polymer of the second film are crosslinked at an interface at which the first layers and the second layers are in contact with each other, to bond the first layer and the second layer of the second film.

The preparing of the first film may further include laminating a third layer including a third polymer and a crosslinking agent on the second layer, the preparing of the second film may further include laminating a third layer including a third polymer on the second layer, and in the hardening, the first layer, the second layer, and the third layer may be simultaneously hardened.

In the hardening, the second polymer and the third polymer may be crosslinked at an interface at which the second layer and the third layer may be in contact with each other, respectively to bond the second layer and the third layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a flexible substrate; and a display panel disposed on the flexible substrate, a support plate which is disposed below the flexible substrate, wherein the flexible substrate includes:

a first polymer layer including a first polymer;

second polymer layers including second polymers and located above and below the first polymer layer; and first interfacial crosslinked layers located between the first polymer layer and the second polymer layers and including a first crosslinked polymer having a network structure in which the first polymer and the second polymer are crosslinked;

adhesive layers located above the second polymer layer located above the first polymer layer and below the second polymer layer located below the first polymer layer and including a third polymer; and second interfacial crosslinked layers located between the adhesive layers and the second polymer layers and including a second crosslinked polymer having a network structure in which the third polymer and the second polymer are crosslinked;

wherein the display device is a foldable display device, wherein the adhesive layer located above the second polymer layer bonds the display panel to the flexible substrate, the adhesive layer located below the second polymer layer bonds the support plate to the flexible substrate, wherein the first polymer layer has a stiffness greater than that of the second polymer layers and the second polymer layer has a softness greater than that of the first polymer layer, the first interfacial crosslinked layer is formed by cross linking the first polymer of the first polymer layer and the second polymer of the second polymer layer by interfacial polymerization at the interface where the first polymer layer and the second polymer layer come into contact, the first polymer includes one or more repeating units selected from Formula A, the second polymer includes one or more repeating units selected from Formula B and the third polymer includes one or more repeating units selected from Formula F as follows as follows,

[Formula A]

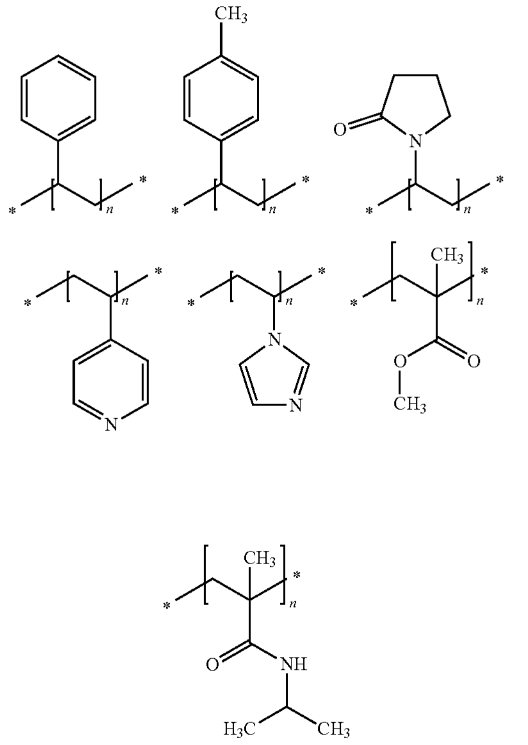

[Formula B]

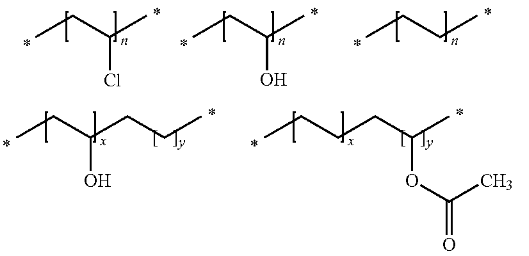

[Formula F]

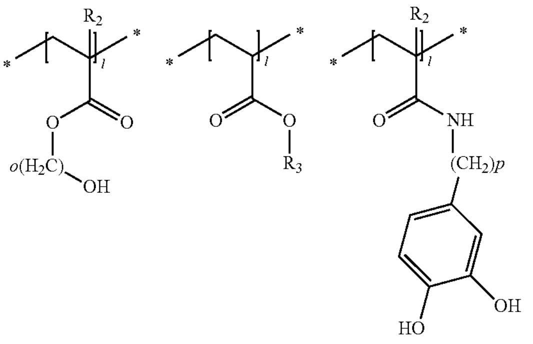

in Formula A and Formula B, n is independently an integer of 500 to 4000, and x is independently an integer of 300 to 2500, and y is independently an integer of 300 to 2500, in Formula F, R2 is independently hydrogen or a methyl group, R3 is an alkyl group having 1 to 10 carbon atoms, and o is an integer of 1 to 10, p is an integer of 1 to 10, and 1 is independently an integer of 500 to 3000, and the first crosslinked polymer is selected from a compound represented by Formula C as follows,

[Formula C]

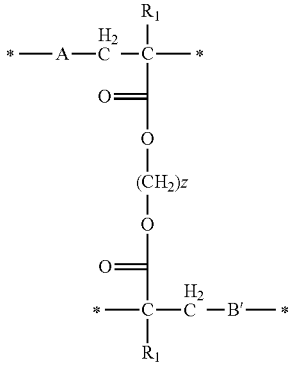

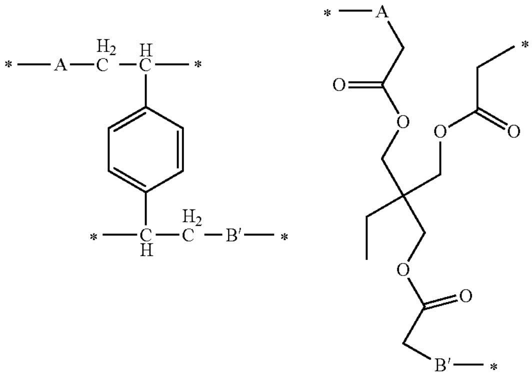

in Formula C, z is an integer of 1 to 10, R1 is independently selected from hydrogen or a methyl group, and A includes one or more repeating units selected from Formula A, and B' includes one or more repeating units selected from Formula B.

2. The display device according to claim 1, wherein the first polymers of the first polymer layer are crosslinked to form a network structure and the second polymers of the second polymer layer are crosslinked to form a network structure.

3. The display device according to claim 2, wherein the first polymer having the network structure is selected from a compound represented by Formula D as follows, Formula D

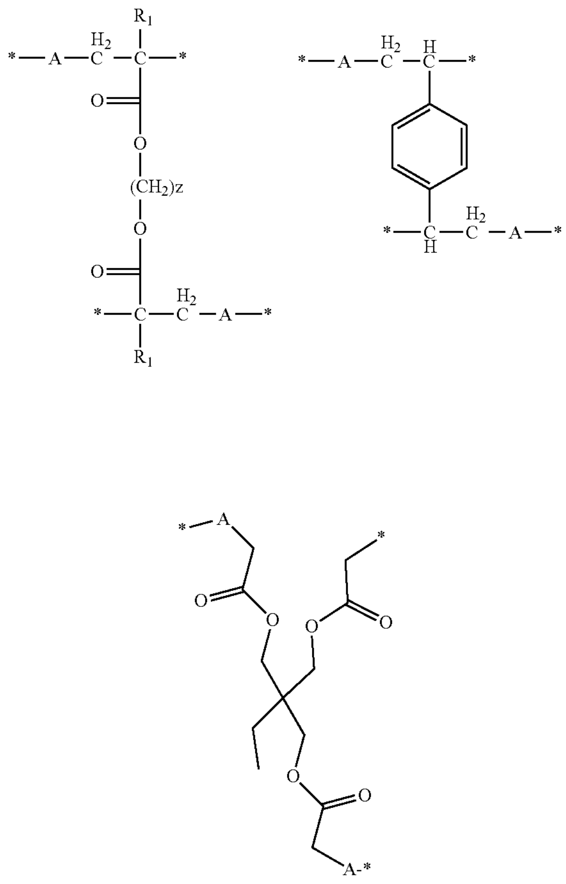

in Formula D, A includes one or more repeating units selected from Formula A, z is an integer of 1 to 10, and R1 is independently selected from hydrogen or a methyl group,

[Formula A]

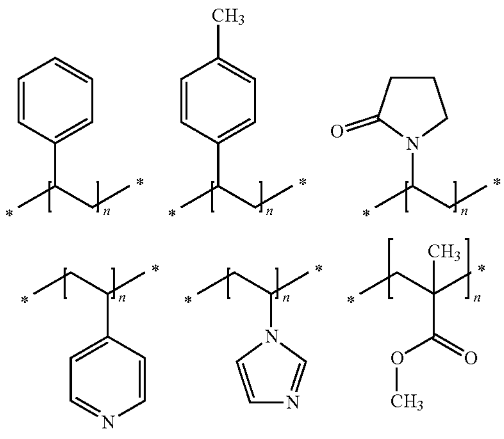

-continued

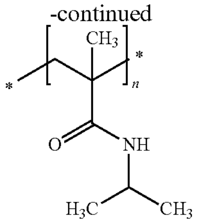

in Formula A, n is independently an integer of 500 to 4000.

4. The display device according to claim 2, wherein the second polymer having the network structure is selected from a compound represented by Formula E

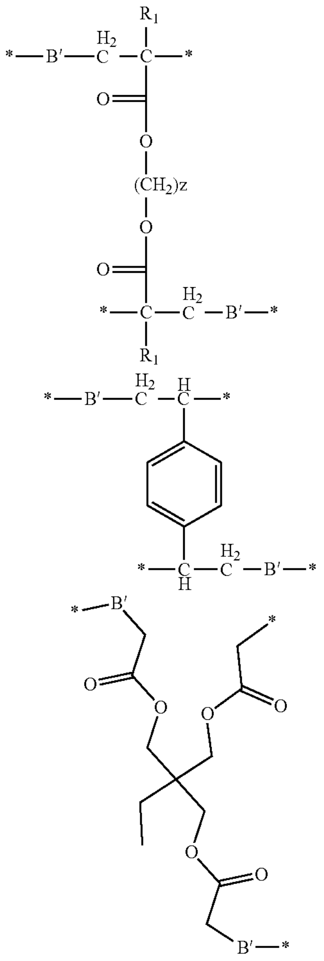

in Formula E, B' includes one or more repeating units selected from Formula B, z is an integer of 1 to 10, and R1 is independently selected from hydrogen or a methyl group,

[Formula B]

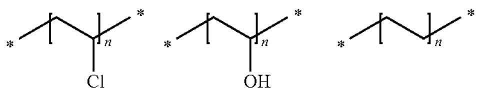

-continued

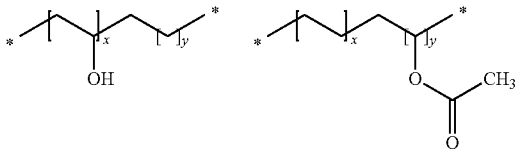

in Formula B, n is independently an integer of 500 to 4000, x is independently an integer of 300 to 2500, and y is independently an integer of 300 to 2500.

5. The display device according to claim 1, wherein the third polymers of the adhesive layer are crosslinked with each other to form a network structure and the third polymer having the network structure is selected from a compound represented by Formula G as follows,

[Formula G]

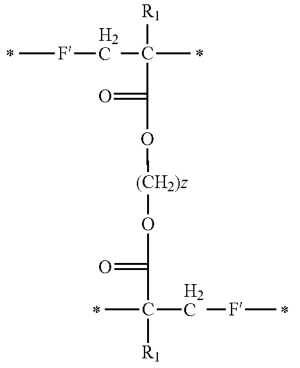

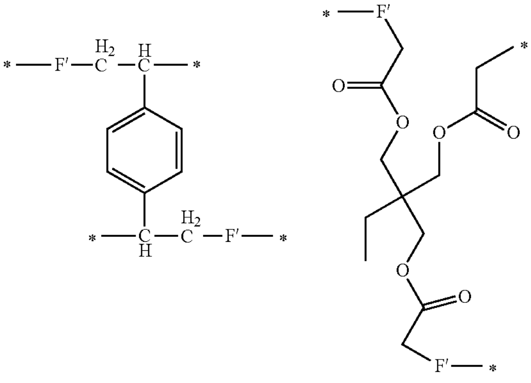

in Formula G, F' includes one or more repeating units selected from Formula F, z is an integer of 1 to 10, and R1 is independently selected from hydrogen or a methyl group.

6. The display device according to claim 1, wherein the second crosslinked polymer is selected from a compound represented by Formula H as follows,

[Formula H]

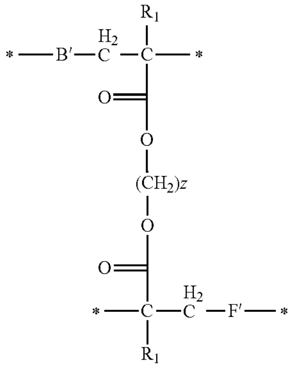

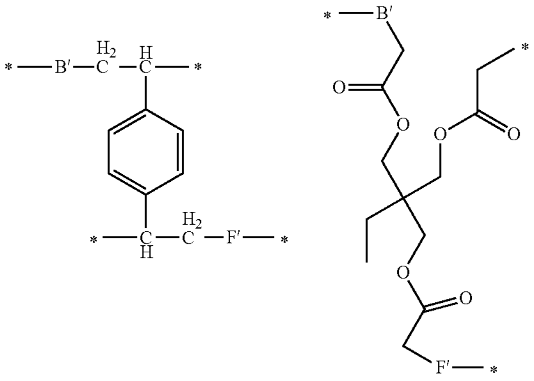

in Formula H, B' includes one or more repeating units selected from Formula B, F' includes one or more repeating units selected from Formula F, z is an integer of 1 to 10, and R1 is independently selected from hydrogen or a methyl group,

[Formula B]

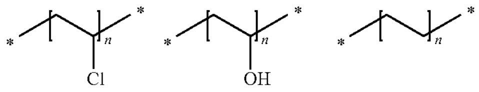

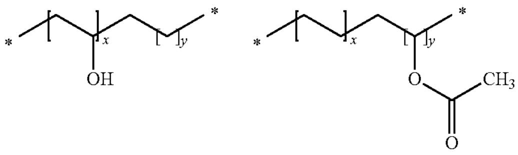

in Formula B, n is independently an integer of 500 to 4000, x is independently an integer of 300 to 2500, and y is independently an integer of 300 to 2500,

[Formula F]
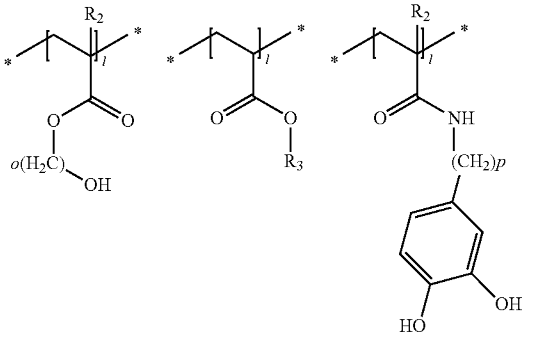
in Formula F, R2 is independently hydrogen or a methyl group, R3 is an alkyl group having 1 to 10 carbon atoms, o is an integer of 1 to 10, p is an integer of 1 to 10, and 1 is independently an integer of 500 to 3000.
* * * * *